(12) United States Patent
Trapp et al.

(10) Patent No.: US 6,451,705 B1
(45) Date of Patent: Sep. 17, 2002

(54) SELF-ALIGNED PECVD ETCH MASK

(75) Inventors: Shane J. Trapp; Kevin G. Donohoe, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 09/653,522

(22) Filed: Aug. 31, 2000

(51) Int. Cl.$^7$ ................................................ H01L 21/00
(52) U.S. Cl. ......................... 438/723; 216/41; 216/79; 438/725; 438/736; 438/743
(58) Field of Search ................................ 438/712, 719, 438/723, 724, 725, 735, 736, 743, 744; 216/2, 41, 47, 49, 51, 67, 79

(56) References Cited

U.S. PATENT DOCUMENTS

| | | | |
|---|---|---|---|
| 4,857,477 A | * | 8/1989 | Kanamori ............... 438/719 X |
| 5,078,833 A | * | 1/1992 | Kadomura ............... 438/719 X |
| 5,206,515 A | | 4/1993 | Elliott et al. ............. 250/492.2 |
| 5,658,472 A | * | 8/1997 | Bertha et al. ............ 438/719 X |
| 5,709,754 A | | 1/1998 | Morinville et al. .......... 134/1.3 |
| 5,798,303 A | | 8/1998 | Clampitt ..................... 438/696 |
| 5,950,092 A | | 9/1999 | Figura et al. ................. 438/399 |
| 6,025,276 A | | 2/2000 | Donohoe et al. ............ 438/734 |
| 6,337,284 B1 | * | 1/2002 | Hwag et al. ............. 438/719 X |

* cited by examiner

Primary Examiner—William A. Powell
(74) Attorney, Agent, or Firm—Whyte Hirschboeck Dudek SC

(57) ABSTRACT

A method for forming an etched feature in a substrate such as an insulator layer of a semiconductor wafer is provided. In one embodiment, the method includes initially etching a substrate layer using a photoresist or other masking layer to form the etched feature (e.g., opening) to a selected depth, and depositing a self-aligning mask layer for a continued etch of the formed feature. In another embodiment of the method, the self-aligned mask is deposited onto a substrate having an etched opening or other feature, to protect the upper surface and corners of the substrate and sidewalls of the feature while the bottom portion of the opening is cleaned or material at the bottom portion of the opening is removed. The present methods utilize the height difference between the bottom portion of the feature and the surface of the substrate to selectively deposit a self-aligning mask layer relative to a pre-formed opening or other feature, for example, to extend an opening to a depth that an original photomask thickness cannot support.

101 Claims, 10 Drawing Sheets

SELF-ALIGNED PECVD ETCH MASK

FIELD OF THE INVENTION

The present invention relates to processing methods in semiconductor device fabrication, and more particularly to methods for forming openings in a substrate, such as contact openings.

BACKGROUND OF THE INVENTION

At several stages during wafer fabrication, it is necessary to form contact openings through insulative material to establish electrical communication with the integrated circuitry. To form contact openings, a masking layer such as a photoresist is typically formed over an insulative layer such as silicon oxide layer, and the contact opening is etched through the insulative layer by exposure to a plasma formed in a plasma reactor. A fluorocarbon plasma is typically used to etch silicon dioxide.

When dry etching a contact opening, the etchants also attack the resist layer causing the resist to gradually erode away, often before the desired depth of the opening is achieved. The erosion of the resist overlying the corners at the mouth of the opening can cause faceting or chamfering of the insulative layer from the contact with the etch gas, resulting in surface roughness and striations in the etch features, and the loss of critical dimensions of the opening being etched. In an array such as a memory cell, contacts are positioned in close proximity to each other, and the erosion and localized breakdown of the photoresist in an etch process can result in the development of notches and other blemishes in the surface of the contact, which can extend to and short circuit an adjacent contact or feature.

The stringent requirements of the etch process (such as rate, profile control, and selectivity to other films in the structure) may not permit that resist selectivity be made high enough to meet the conflicting manufacturing requirements that a) the resist be thin enough to be easily patterned with the lithography equipment in use, and b) the resist be thick enough to provide adequate masking for the etch process.

Therefore, a need exists for a method of etching silicon oxide layers to provide high aspect ratio openings that overcomes these problems.

SUMMARY OF THE INVENTION

The present invention provides processing methods for forming via or other contact openings using a self-aligned etch mask of a polymeric material.

The invention utilizes a self-aligning method to deposit a masking layer for a continued etch of a formed contact opening downwardly in a substrate, thus eliminating the need to something in production to compensate for a process with relatively high resist erosion. Typically, a higher selectivity process can be used. Such a process will be more expensive to operate because it will have a smaller process window and be more sensitive to variations in incoming material. Thus, it will generate more scrap and be more costly to operate. Alternatively, a hard mask under the resist layer may be used. Such a mask might be polysilicon or silicon nitride. These masks are costly to deposit, must be separately etched and subsequently removed.

The present method applies a polymerizing gas surface-wide over a substrate having a formed opening, and utilizes the height difference, or aspect ratio, between the base of the opening and the surface of the substrate to selectively deposit a polymer mask layer onto the surface of the substrate and the sidewalls of the opening to a limited depth. Thus, the polymer layer self-aligns relative to the pre-etched contact opening and serves as an etch mask, for example, to extend the etch depth to a level that the original photomask thickness cannot support. A feature can be etched by repetitively depositing the mask and etching the feature until the desired depth is achieved. The self-aligned mask can be used to clean the base (i.e., bottom of the partially etched feature), or extend the etch depth of an etched opening while protecting the exposed surface of the substrate and upper corner of the opening.

In one embodiment of the method of the invention, a self-aligning etch mask is used to continue the etch of an etched feature that is initially formed to a first selected depth in the substrate using a photoresist or other masking layer deposited over a substrate. The first depth of the etched feature is sufficient such that substantially no polymer material is deposited on the substrate at the bottom portion of the etched feature in a subsequent polymer deposition step. Preferably, the aspect ratio of the etched feature (i.e., ratio of the depth to the diameter of the feature) is at least about 0.5, preferably greater than about 0.5, more preferably greater than about 1.

According to the invention, the self-aligned, etch resistant mask layer is formed over the masking layer and the etch is continued. It is preferred that the self-aligned mask layer is formed over a portion of the sidewalls of the etched feature contiguous with the surface of the substrate to a limited depth into the etched feature, to cover and protect the corners and the sidewalls of the substrate from being eroded during a subsequent etch step.

Preferably, the self-aligned mask layer is deposited from a polymerizing gas by plasma enhanced chemical vapor deposition using a dual source high density plasma etcher, to form an etch resistant polymer material layer of a predetermined thickness. Exemplary polymerizing gases include fluorocarbons, hydrofluorocarbons, and chlorofluorocarbons, among others. A second etching can then be performed to extend the etched feature downwardly to a selected second depth.

During the deposition step, the thickness of the self-aligned mask can be controlled and modified to provide an effective covering to prevent etching of the substrate, while maintaining the mouth of the etched feature at a suitable width for a subsequent etch of the feature, by varying the bias power, the source power, and/or the deposition time configurations of the etcher. In addition, the etch selectivity/resistivity of the mask layer can be controlled by varying the setting for the source power of the etcher. The use of power to accomplish the self aligned deposition is preferred because power can be changed almost instantly and is, in most processing tools, well controlled and repeatable. It may be necessary to change other variables, most notably gas flow rate or gas pressure, to accomplish the self aligned deposition.

The self-aligned mask can thus be deposited on a layer of photoresist or other masking layer to continue the etch of a formed feature in a substrate (e.g., oxide, among others). In another embodiment, the self-aligned mask can also be formed over a masking layer that has been patterned with openings to expose an underlying substrate (e.g., oxide layer) that is to be initially etched to form a feature. Preferably, the openings of the mask layer have an aspect ratio at least about 0.5, preferably greater than about 1, such that polymer material deposited from a polymerizing gas is not deposited onto the substrate at the bottom of the mask opening when the self-aligned mask layer is formed.

In another embodiment of the method of the invention, a self-aligning etch mask is used to remove an etchable material from the bottom portion of an etched feature, while protecting the exposed surface of the substrate and upper corners of the feature. For example, a substrate having an etched feature and an overlying layer of an etchable material (e.g., silicon nitride, polysilicon) formed over the surface of the substrate including the sidewalls and bottom portion of the feature, can be processed to remove a portion of the etchable layer from the bottom of the etched feature. Preferably, the aspect ratio of the feature is at least about 0.5, preferably greater than about 0.5, more preferably greater than about 1, such that substantially no polymer material is deposited onto the substrate at the bottom portion of the feature in a subsequent polymer deposition step.

A self-aligned, etch resistant mask layer can then formed to a selected thickness over the upper surface of the etchable layer and, preferably contiguously over the corners of the etchable layer and extending into the etched feature for a limited depth. The mask layer effectively protects the etchable layer formed on the upper surface and along the sidewalls of the etched feature from being removed/damaged in a subsequent etch step. Preferably, substantially no polymeric material is deposited onto the etchable layer overlying the bottom portion of the opening. The self-aligned mask layer can be deposited from a polymerizing gas such as a fluorine-, chlorine-, or hydrocarbon-containing gas, and mixtures thereof, by plasma enhanced chemical vapor deposition using a dual source high density plasma etcher. After applying the self-aligned mask layer, the etchable layer overlying the bottom portion of the etched feature is then removed to expose the substrate on the bottom portion of the etched feature. The feature can also be extended past the etchable layer to result in a feature with sidewalls of differing materials. The thickness of the self-aligned mask can be modified by varying the bias power, the source power, and/or the deposition time configurations of the etcher. The etch selectivity/resistivity of the self-aligned mask layer can be modified by varying the configuration for the source power of the etcher.

Etching a deep feature utilizing the present invention, requires depositing only a thin photolithographic mask to start the etch and to set the stage for the sequential self-aligned mask deposition and etch sequences to increase the etch depth of the feature. The use of the self-aligned mask greatly simplifies the lithographic process by reducing the required thickness of the photoresist mask.

Another process capability enabled by the invention is the ability to clean the base or bottom portion of an etched feature, for example, a contact that has damaged silicon at the bottom of the opening, while protecting the exposed surface of the substrate and upper corner of the etched feature. This allows the cleaning step to be anisotropic and conserves the cd budget. It also allows the use of a cleaning agent that could otherwise remove surface material from the exposed surface of the structure.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The present invention provides a method for etching of a layer on a semiconductor wafer or other substrate, to provide an etched feature such as a via or contact opening having a high aspect ratio.

FIGS. 1A–1F depict a first embodiment of the method of the invention, in which an etched feature is formed by first etching an exposed area of an etchable layer (e.g., silicon oxide) through an opening in a photoresist or other patterned mask layer, to a first depth, and then second etching the formed feature to a second depth using a self-aligned polymer mask.

Figure 1A:
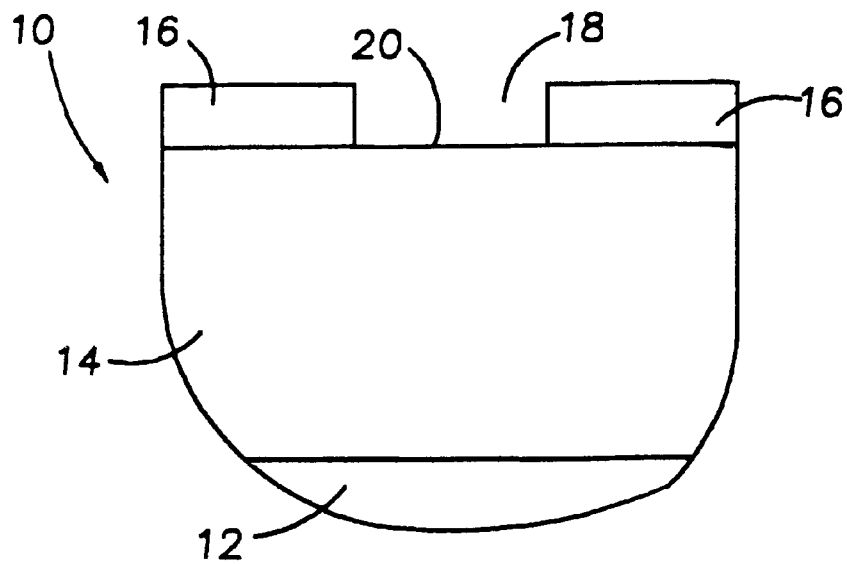
FIG. 1A is a diagrammatic cross-sectional view of a semiconductor wafer fragment at a preliminary step of a processing sequence according to a first embodiment of the method of the present invention.

Referring to FIG. 1A, the wafer fragment 10 includes a substrate 12, and a layer of material 14 formed over the substrate 12 that comprises an etchable material into which an etched feature (e.g., contact opening) is to be formed. An exemplary etchable material for layer 14 is a dielectric or insulating material, for example, silicon dioxide, or a doped silicon dioxide such as phosphosilicate glass (PSG) and borophosphosilicate glass (BPSG), among others, in a single layer or multiple layers. Such dielectric layers typically overlay a silicon-comprising substrate 12 such as single crystal silicon, epitaxial silicon, polysilicon, or silicides such as titanium silicide.

The etched feature can be initially formed by a conventional etch process that includes forming a masking layer 16, such as a layer of photoresist, over the etchable layer 14 and patterning the masking layer to define an opening 18 that exposes an area 20 of the etchable layer 14 where the feature is to be etched. The masking layer 16 can be deposited, patterned and developed to provide a desired contact pattern using conventional photolithographic techniques as known in the art.

Figure 1B:
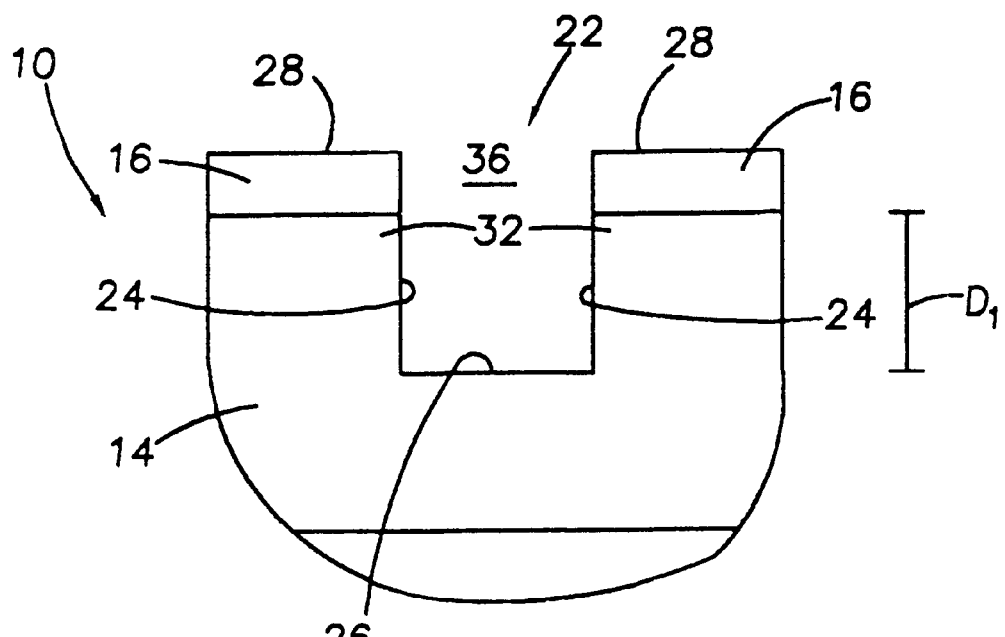
FIGS. 1B–1D are views of the wafer fragment of FIG. 1A at subsequent and sequential processing steps.

Referring to FIG. 1B, a first etching of the etchable layer 14 through the mask opening 18 is performed to etch anisotropically a feature 22, (e.g., opening) having substantially vertical sidewalls 24 and a bottom portion 26. The feature 22 is initially etched to a first depth $D_1$, utilizing the photoresist or other masking layer 16.

The feature 22 provided by the first etching using the masking layer 16 has a sufficient first depth $D_1$ such that, when the wafer 10 is subsequently exposed to a polymerizing gas, substantially no polymeric material is deposited on the bottom portion 26 of the feature 22. To that end, it is preferred that the aspect ratio (i.e., the height-to-width ratio) of the contact opening 22 is greater than about 0.5, more preferably greater than about 1. For example, a feature having a width of about 0.25 µm, preferably has an etch depth of about 0.125 to about 0.25 µm or greater.

The etching process and gases used to form the etched feature 22 in the etchable layer 14 are dependant upon the material to be etched and can be performed by conventional etch processes as known and used in the art. Etching of the silicon dioxide layer is preferably by dry plasma etch, which is generally conducted within an etch chamber of a plasma generating device. The plasma etch technique can include the use of reactive ion etching (RIE), plasma etching (PE), or other type of etching technique, for example, electron cyclotron resonance (ECR), magnetically enhanced cyclotron resonance (MERIE), among others, as known and used in the art. Various etch parameters such as the gas mixture, temperature, RF power, pressure, and gas flow rate, among others, can be varied to achieve the desired etch rate and etch characteristics of the plasma system, as also known in the art.

Useful etch gases are halogen-containing gases including fluorine-containing gases and/or chlorine-containing gases. Fluorine-containing gases are typically used to etch silicon oxides, and include, for example, $CF_4$, $CHF_3$, $C_2F_6$, $C_3F_8$, $C_4F_8$, among others. Plasma etching of silicon nitride can be obtained with the use of $CF_4/O_2$, $CHF_3/O_2$, $CH_2F_2$ and $CH_3F$ plasmas, among others. A polysilicon or metal layer can be etched using a gas plasma comprising a chlorine- or bromine-based plasma such as HBr, $HBr/O_2$ and $HBr/Cl_2/O_2$, among others. The polymerizing gas can also include inert carrier gases.

Although not shown, after etching of the feature 22 to a first depth DI is completed, the masking layer 16 can optionally be stripped to remove a portion or all of the masking layer 16. The photoresist or other masking layer 16 can be removed by a conventional process dependant upon the material used to form the masking layer. Conventional dry etch process to remove a resist is a dry plasma ashing technique by which an oxygen plasma is generated in a plasma etch chamber (i.e., RF plasma machine) to oxidize the resist.

According to the method of the present invention, a self-aligned mask can then be applied to continue the etch of the formed feature 22 downwardly into the layer of etchable material 14. The self-aligned mask layer 30 can be conformally deposited surface-wide over the wafer (target) surface from a polymerizing gas over the masking layer 16, to result in the structure shown in FIG. 1C. The present method utilizes the height difference, or aspect ratio, between the bottom portion of the feature and the surface of the substrate, i.e., the depth $D_1$ of the feature 22, provided by the first etching to selectively deposit polymer material onto the surface 28 of the masking layer 16 and the sidewalls 24 of the feature 22 to a limited depth. As such, the polymer layer 30 self-aligns relative to the feature 30 and serves as a mask for the subsequent etching of the feature. The wafer 10 is exposed to the polymerizing gas under conditions and a time period effective to deposit the self-aligned mask layer 30 to a predetermined thickness $T_1$ over the exposed surfaces of the wafer including the surface 28 of the masking layer 16.

Figure 1C:
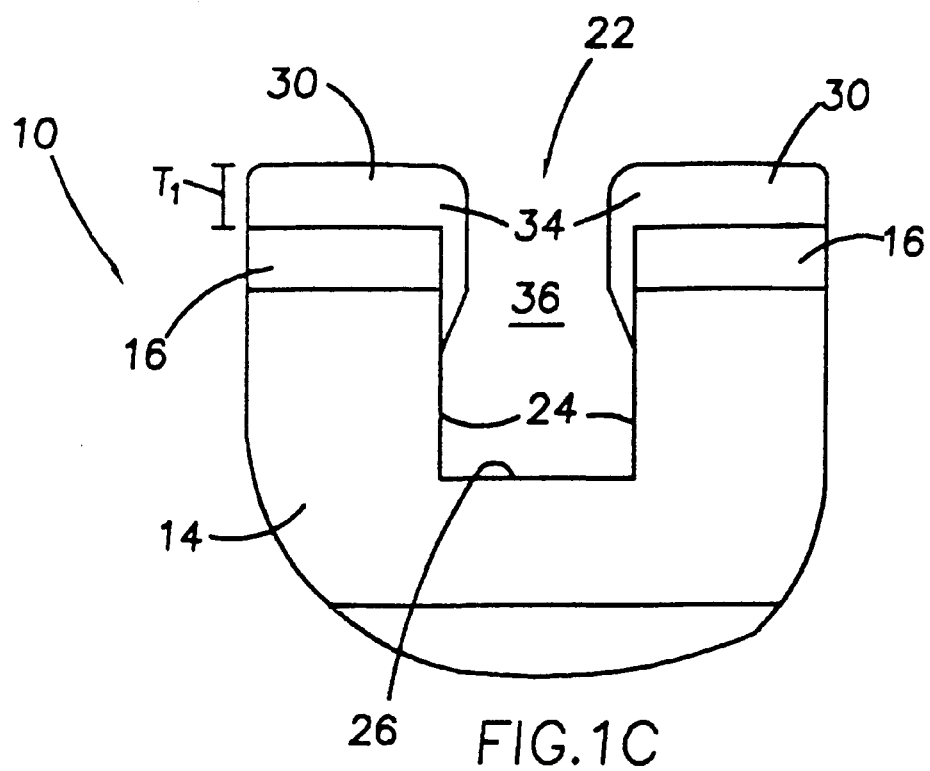

As depicted in FIG. 1C, it is preferred that the self-aligned mask layer 30 is formed over the surface 28 of the masking layer 16 and extends into the feature 22 over a portion of the sidewalls 24, preferably in a continuous layer to cover the corners 32 of the etchable layer 14. It is further preferred that the deposition step results in a polymer layer 30 whereby a bulge or lateral growth is formed in the area 34 at the interface between the sidewalls 24 and the surface 28 of the masking layer 16, to cover the corners 32 of the etchable layer 14. This phenomenon is known as "cusping" or "breadloafing."

Coverage of the corners 32 of the etchable layer 14 with the self-aligned mask layer 30, particularly the breadloaf area 34, helps protect the sidewalls 24 from lateral etching and prevents etch-off and/or faceting of the corners 32 in a subsequent etching step, which wears away the etchable layer resulting in surface roughness and striations in the etch features, and the loss of critical dimensions of the opening 22 being etched. In an array such as a memory cell, contacts are positioned in close proximity to each other, and the erosion of the etchable 14 layer can result in the development of notches and other blemishes in the surface of the contact or feature, which can extend to and short circuit an adjacent contact.

Depending on the application, any thickness of the self-aligned mask layer 30 can be useful, but a self-aligned mask layer 30 of about 50 angstroms or greater is preferred for most applications, preferably about 2500 angstroms. The thickness of the mask layer at the breadloaf area 34 should effectively cover the corners of the etchable layer and protect them from being etched, but not project into the opening 22 to substantially constrict the mouth 36 of the feature 22, whereby a subsequent etch of the feature 22 is inhibited, resulting in the profile of the sidewalls becoming tapered.

It is highly preferred that substantially no deposit (i.e., layer) is formed from the feed gas(es) on the bottom portion 26 of the partially etched of the feature 22 (or other feature) that would inhibit downward etching of the feature 22. This can be controlled, at least in part, by initially etching the feature 22 to an aspect ratio of greater than about 0.5, preferably greater than about 1.0, and/or varying the parameters used in applying the polymerizing gas. For example, to limit the depth of the deposition of the polymerizing gas into the feature 22 using a dual source high density plasma etcher, the following parameters can be controlled: source power, bias power, gas flow rate(s), pressure, and chamber walls and wafer temperatures.

Polymerizing gases for forming the self-aligned mask layer 30 on a silicon oxide or other etchable layer 14 include fluorocarbons and hydrofluorocarbons. Exemplary gases include $CF_4$, $CHF_3$, $CH_2F_2$, $CH_3F$, $C_2F_6$, $C_2HF_5$, $C_3F_6$, $C_4F_8$, and mixtures thereof. Higher molecular weight polymerizing gases as well as hydrocarbons and other halocarbons, for example, $CCl_4$, can be used. In general, polymerizing gases that are the same as or similar to the etch gases are preferred. Therefore, a chlorocarbon, such as $CCl_4$, would be preferred in an aluminum etching and a fluorocarbon would be preferred in an oxide etching. Mixed halogen-containing gases such as $CFCl_3$ and $CF_2Cl_2$, and halogenated hydrocarbons such as $C_2HCl_3$, among others, and mixtures thereof, are also useful. Examples of other suitable polymerizing gases include iodine-containing gases and higher molecular weight hydrocarbons such as $C_2H_4$, $C_3H_8$, $C_3H_6$, $C_4H_6$, $C_4H_8$, and cyclic or aromatic compounds.

To apply the self-aligned mask layer 30, the wafer 10 of FIG. 1B can be placed into a chamber of a plasma source such as a conventional plasma etcher or a high density plasma etcher (not shown), and exposed to a polymerizing gas using a conventional plasma enhanced vapor deposition (PECVD) process. High density plasma etchers operate at pressures below 50 mtorr (typically below 25 mtorr) and have plasma densities greater than $10^{10}$ to $10^{11}$ cm$^{-3}$. In addition, most etch applications of high density plasma etchers use two sources of electrical power, one to generate the plasma (e.g., source power) and one to bias the wafer (e.g., bias power). An exemplary etcher in which processing can take place is a Lam 9100 Etcher, which is a dual source high density plasma etcher.

For example, in using a dual source high density plasma etcher (not shown) in a semiconductor processing method to form an etched feature (e.g., contact opening) according to the invention, the etcher is configured at a first bias power and a first source power, and a substrate 12 having a masked layer 14 formed thereover through which a contact opening 22 is to be etched, is placed onto the wafer receiver of the etcher. The etchable layer 14 is plasma etched while the etcher is powered at the first bias power and the first source power, to form the feature 22 to a first selected depth $D_1$, preferably a feature 22 having an aspect ratio of at least about 0.5 µm.

The etcher is then set at a selected deposition time, and configured to vary the source power and vary the bias power, whereupon an etch resistant polymer material is deposited onto the etchable layer 14 by PECVD utilizing a polymerizing gas to form the self-aligned mask 30 over the surface 28 of the masking layer 16 and a portion of the sidewalls 24 contiguous with the surface 28. Substantially no polymeric material is deposited onto the etchable layer at the bottom portion 26 of the opening 22 during the deposition step. The etcher is then configured to vary the source power and vary the bias power, and the etchable layer 14 is plasma etched to extend the feature 22 downwardly to a second selected depth $D_2$, resulting in the structure shown in FIG. 1D.

To form or deposit a self-aligned mask layer 30 about 3000 angstroms thick over the surface 28 of a masking layer 16 and a portion of the sidewalls 24, and form a breadloaf area 34 about 700 angstroms thick over the corners 32, using an Applied Materials IPS Etcher and one or more fluorocarbon gases, the following settings can be used:

Source (top) Power: From about 800 to about 1400 watts, preferably about 1100 watts Bias (bottom) Power: From about 1 to about 200 watts, preferably about 100 watts Pressure: From about 15 to about 40 mtorr, preferably about 20 mtorr Duration: From about 10 to about 60 seconds Flow Rate ($C_4F_8$ and $CHF_3$): From about 5 to about 25 sccm (each)

There is an interaction between the above listed parameters, and the settings can be altered to customize the deposition rate, formation and the thickness of the self-aligned mask layer 30 over the etchable layer 14. For example, during the deposition step, the source power, the bias power and/or the deposition time can be varied to control and modify the thickness of the self-aligned mask such that an adequate mask thickness is provided to prevent etching of the surface, corners and sidewalls of the layer, yet maintain a feature having a width sufficient to ensure the desired etch results. Preferably, the deposition of the polymer is regulated to control the extent and thickness of a breadloaf formation 34 such that the mouth 36 of the feature 22 is not substantially obstructed which would hinder the subsequent etch of the feature downwardly into the etchable layer 14 and result in the profile of the sidewalls becoming tapered rather than being etched vertical.

For example, forming a relatively thin layer of the self-aligned mask layer 30 of about 1000 to about 1500 angstroms/microns on the surface 28 of the masking layer 16 and sidewalls 24 results, at least in part, from operating at a relatively high bias voltage of about 50 to about 150 watts, and a lower deposition rate of about 1000 angstroms/minute, which would include lowering the source power to the etch apparatus to about 800 to about 900 watts. The thickness $T_1$ of the self-aligned mask layer 32 can also be varied by the duration of the deposition step. After a short transient period, the layer thickens as the deposition time is increased. Therefore, by limiting the duration of the deposition process, a relatively thin layer of the self-aligned mask layer 32 can be deposited.

In general, the selectivity of the self-aligned mask material in the subsequent etch process depends on the chemical structure of the film. The fluorocarbon polymer chemistry can be used as an example. It is well known that films that have a higher carbon/fluorine atomic ratio usually have lower etch rates than films with lower carbon/fluorine ratios. Methods of increasing this ratio include higher source power to dissociate more free fluorine from the feed gas, or higher bias power to sputter more fluorine from the polymer film. The interaction between the flow rate, powers, and other chamber variables makes it difficult to quantify how the selectivity will change with conditions. The optimization of the process involves obtaining the desired self-aligned shape of the deposit and then varying conditions inside the shape-defined process window to obtain adequate selectivity. Feed gases that are relatively fluorine deficient, such as $C_4F_8$, are generally preferred if selectivity is an issue.

Figure 1D:
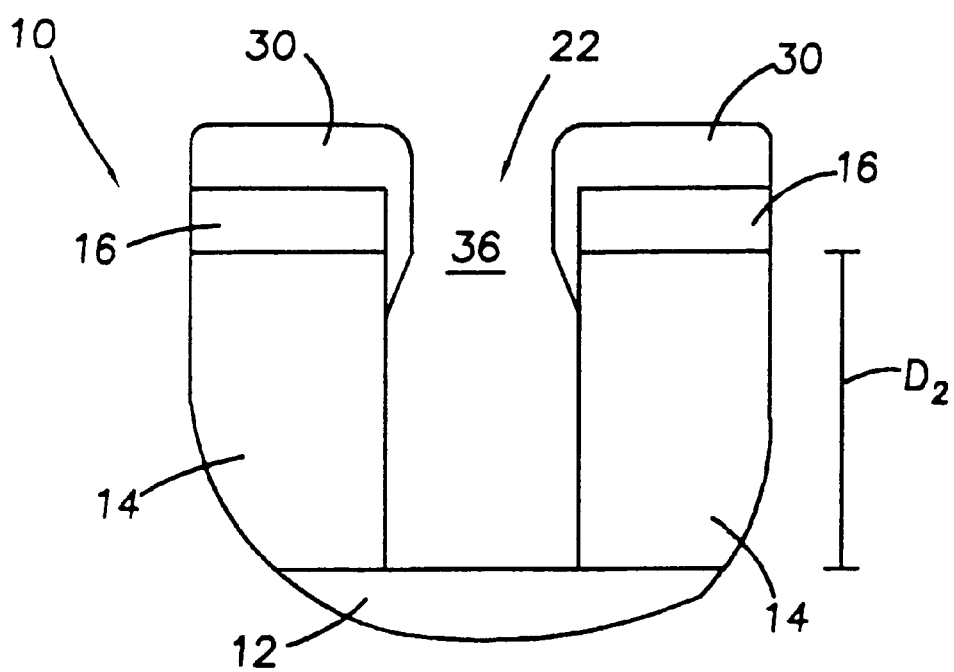

Upon depositing a sufficiently thick layer 30 of the self-aligned mask over the surface 28 of the masking layer 16 and, preferably, over the corners 32 and onto the adjoining portion of the sidewalls 24 of the feature 22, the feature 22 is further etched downwardly into the etchable layer 14, as shown in FIG. 1D. Etching of the feature 22 can be according to a conventional etch process known and used in the art, preferably by plasma etch as discussed hereinabove for the first etching of the contact opening.

Although not shown, upon etching the contact opening 22 to the desired depth $D_2$, the self-aligned mask layer 30 and remaining masking layer can be removed to uncover the etchable layer 14, corners 32a, and the sidewalls 24 of the feature 22. A conventional removal process similar to those used for stripping photoresist, for example, a conventional plasma asher, can typically be used to remove the self-aligned mask layer 30 and masking layer 16. The removal step is performed for a time duration effective to remove the polymer material and masking material overlying the etchable layer 14, which is determined, at least in part, by the thickness of the layers 16, 30.

Optionally, after removing the self-aligned mask layer 30, the substrate 12 at the bottom portion 26 of the feature 22 can be cleaned to remove contaminants including hydrocarbons, fluorocarbons, and other organic residues. A conventional $O_2$ clean etch can be used to remove organic residue from the substrate 12 at the bottom portion 26 of the feature.

Although not shown, the feature 22 can be further extended downwardly into the etchable layer 14 or a layer of material (not shown) underlying the etchable layer 14, to a predetermined depth $D_3$, by repeating the foregoing steps of depositing the self-aligned mask layer 30 over the layer to be etched, and further etching the feature 22 to a desired depth.

Figure 2A:
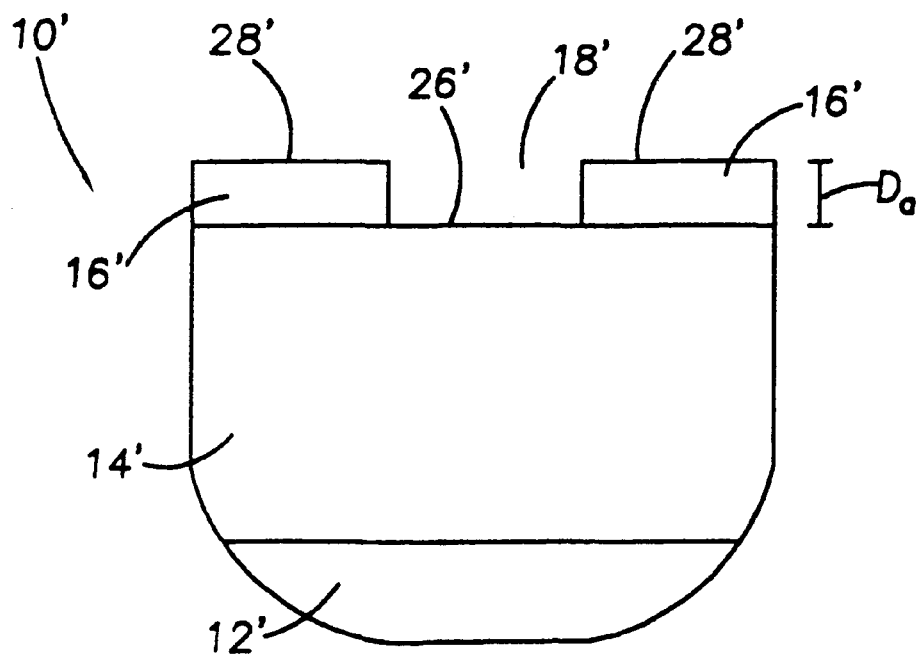
FIG. 2A is a diagrammatic cross-sectional view of a semiconductor wafer fragment at a preliminary step of a processing sequence according to another embodiment of the method of the present invention.
Figure 2B:
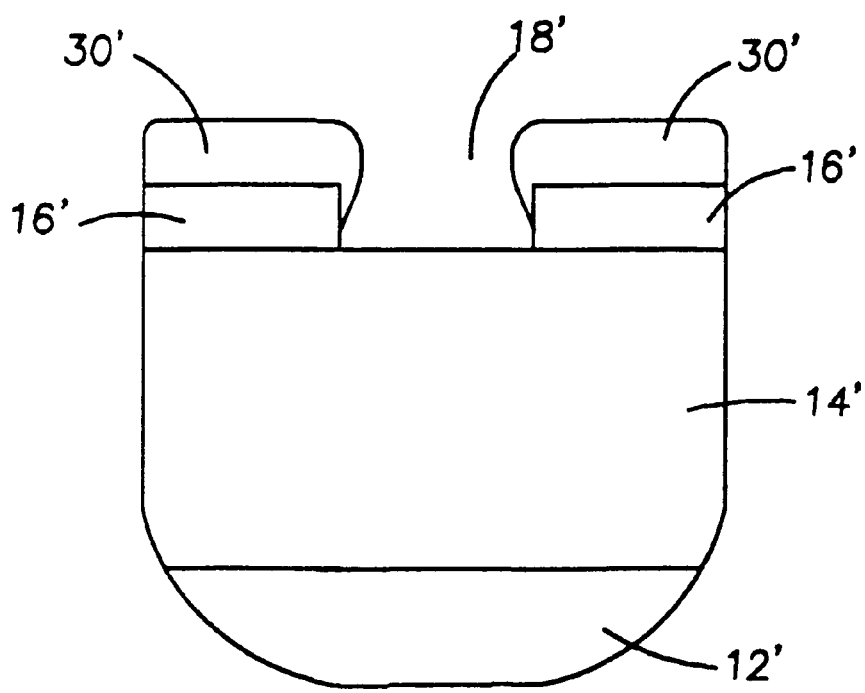
FIGS. 2B–2C) are views of the wafer fragment of FIG. 2A at subsequent and sequential processing steps.
Figure 2C:
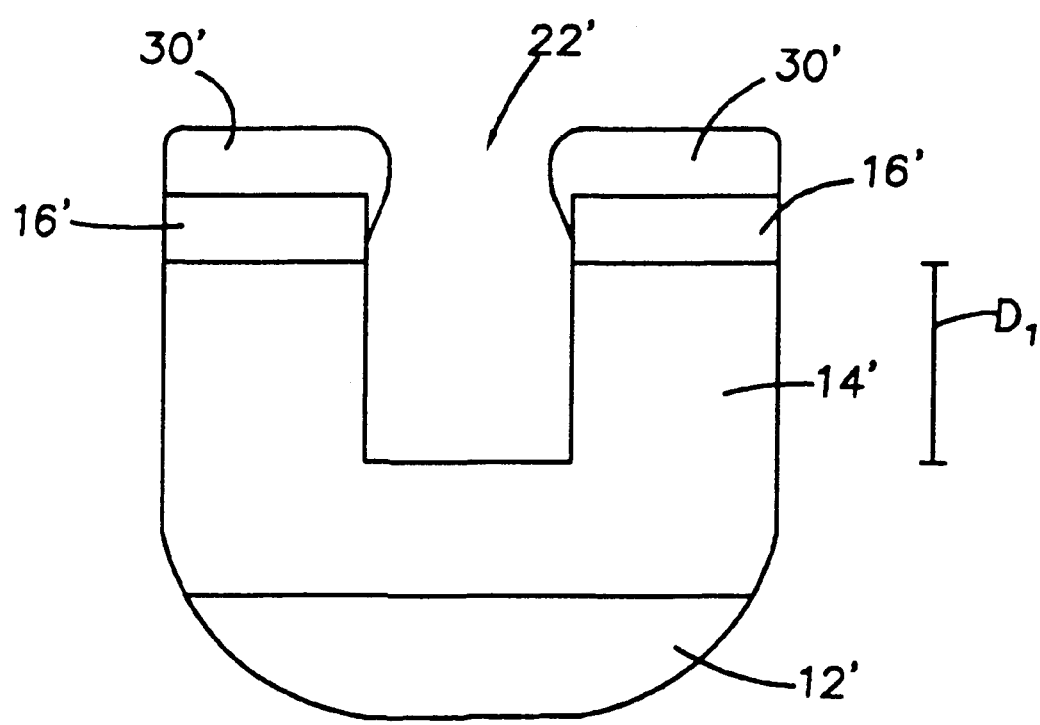

In another embodiment, depicted in FIGS. 2A–2C, the method can be used to form a self-aligned mask over a patterned masking layer having one or more openings, to build up and/or protect the masking layer for etching a feature onto a substrate. A wafer 10' is depicted in FIG. 2A as having a photoresist or other masking layer 16' deposited on a layer 14' to be etched to form a desired feature 22'. The masking layer 16' has been deposited to a predetermined thickness to provide the opening 18' formed in the masking layer with a sufficient depth $D_a$ such that polymer material subsequently deposited onto the wafer 10' to form the self-aligned mask is not substantially deposited onto the etchable layer 14 at the bottom portion 26' of the opening 18'. The self-aligned mask layer 30' is then deposited from a polymerizing gas, as previously described, onto the surface 28' of the masking layer 16' and into the opening 18'. The feature 22' can then be etched downwardly into the etchable layer 14' to a desired depth $D_1$. As previously described, additional layers of the self-aligned mask can be deposited over the existing mask layers 16', 30', to continue the etch of the feature 22'.

In certain applications, a layer of material is deposited into a feature such as a contact opening and it is desirable to maintain the deposited layer on the sidewalls but not the base of the opening. According to another embodiment of the method of the invention, a self-aligned mask layer can be used to selectively remove an etchable material from the bottom portion of a contact opening or other feature, as depicted in FIGS. 3A–3D.

Figure 3A:
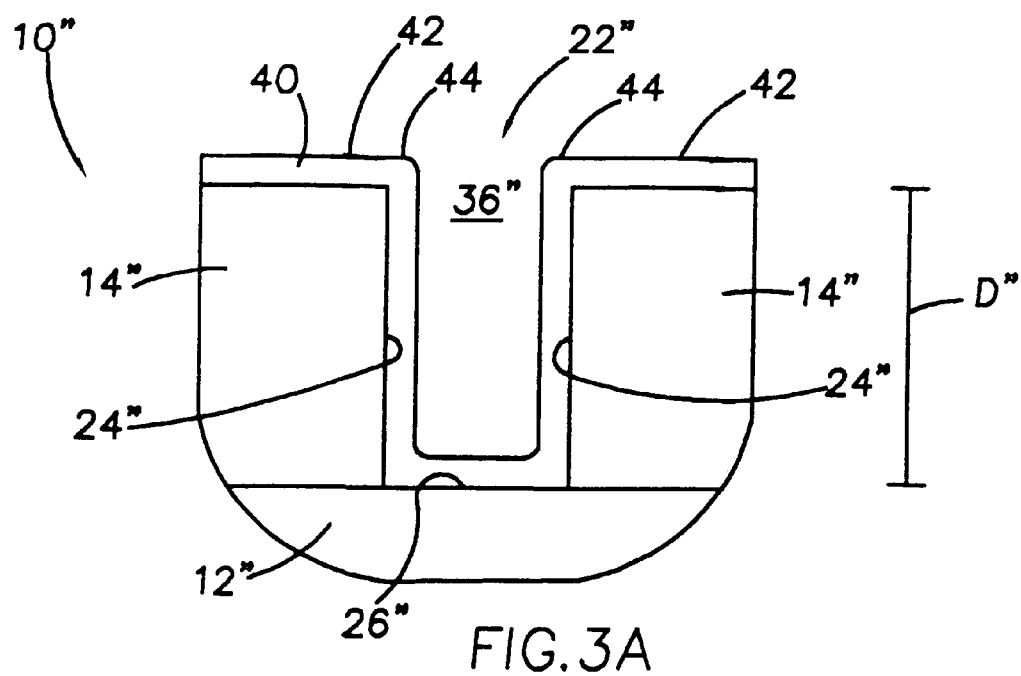
FIG. 3A is a diagrammatic cross-sectional view of a semiconductor wafer fragment at a preliminary step of a processing sequence according to another embodiment of the method of the present invention.

Referring to FIG. 3A, the wafer fragment 10" includes a semiconductive substrate 12" and a first layer of an etchable material 14" formed over the substrate 12" into which a feature 22" (e.g., contact opening) has been formed by a conventional prior art etch process. A second layer of an etchable material 40 has been deposited onto the first etchable layer 14", including the sidewalls 24" and bottom portion 26" of the feature 22".

Exemplary materials for the second etchable layer 40 include silicon nitride ($Si_3N_4$), silicon oxides such as silicon dioxide, oxide deposited from tetraethylorthosilicate (TEOS), or a doped silicon dioxide such as phosphosilicate glass (PSG) and borophosphosilicate glass (BPSG), a conducting material such as polysilicon or a metal, or a seed layer to control, for example, subsequent selective depositions. Such materials can be deposited onto the wafer by conventional deposition methods as known and used in the art, for example, by a low pressure chemical vapor deposition (LPCVD) process.

Figure 3B:
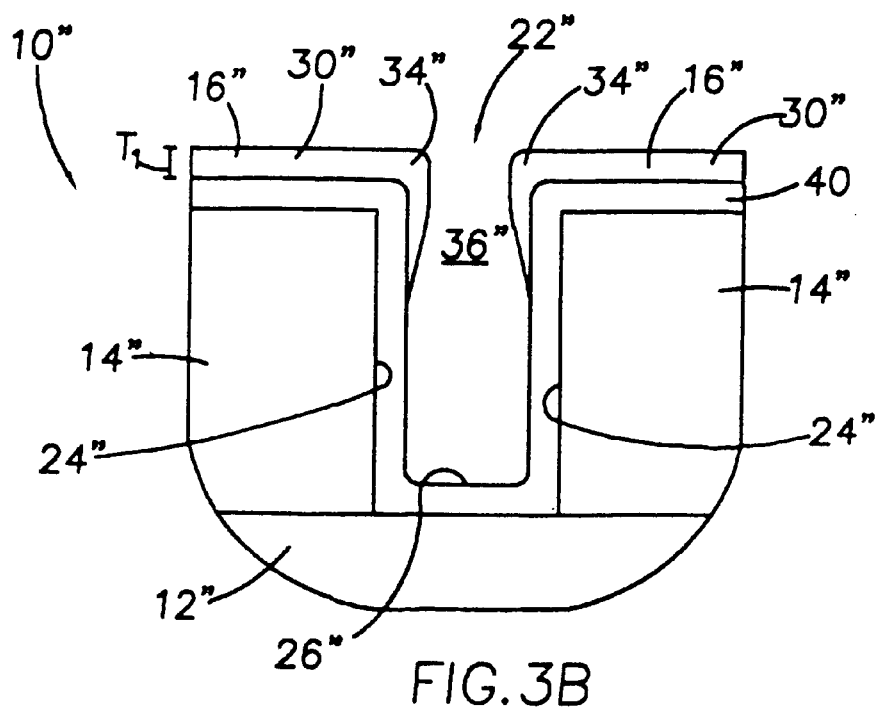
FIGS. 3B–3D are views of the wafer fragment of FIG. 3A at subsequent and sequential processing steps.

According to the invention, a layer of polymer material that is resistant to the etch gas mixture of a subsequent etch step is deposited surface-wide over the wafer surface, to result in the structure shown in FIG. 3B. The polymer material is deposited as a layer to form a self-aligned mask layer 30" over the second etchable layer 40. Preferably, the self-aligned mask layer 30" is formed over both the surface 42 of the second etchable layer 40 and extends continuously and conformally over the corners 44 and into the feature 22" to cover a portion of the second etchable layer 40 overlying the sidewalls 24". It is preferred that a breadloaf area 34" is formed over the corners 44 having a thickness effective to prevent etch-off or faceting of the corners 44 and lateral etching of the second etchable layer 40 overlying the sidewalls 24", but not substantially obstruct the mouth 36" of the feature 22" during a subsequent etch of the feature 22" to remove the portion of the second etchable layer 40 overlying the bottom portion 26" of the feature 22".

The self-aligned mask layer 30" can be deposited to a desired thickness $T_1$ as described hereinabove with regard to the first embodiment of the method, using one or more of the aforementioned polymerizing gases in a conventional PECVD process or other suitable deposition technique. In general, a mask layer 30" having a thickness $T_1$ of about 200 to about 1000 angstroms is suitable for most applications. The optimal $T_1$ value depends on the thickness of the film 40, the aspect ratio of the feature 22" and the selectivity between the film 40 and the self-aligned mask layer 30" during the etch that removes the second etchable layer 40. As previously discussed, the thickness and selectivity of the self-aligned mask layer 30" can be controlled and modified by varying the process settings or configuration of the plasma etcher used to deposit the polymer material onto the wafer 10".

To ensure the selective removal of the second etchable layer 40 from the bottom portion 26" of the feature 22", it is preferred that substantially no polymerizing gas is deposited onto the second etchable layer 40 overlying the base 26" of the feature 22" during the formation of the self-aligned mask layer 30". To control this, at least in part, the feature 22" is etched to a depth (D") whereby the aspect ratio is at least about 0.5, preferably at least about 1. Deposition of the polymerizing gas into the feature 22" can also be controlled by varying the parameters used in applying the polymerizing gas, as discussed hereinabove.

Figure 3C:
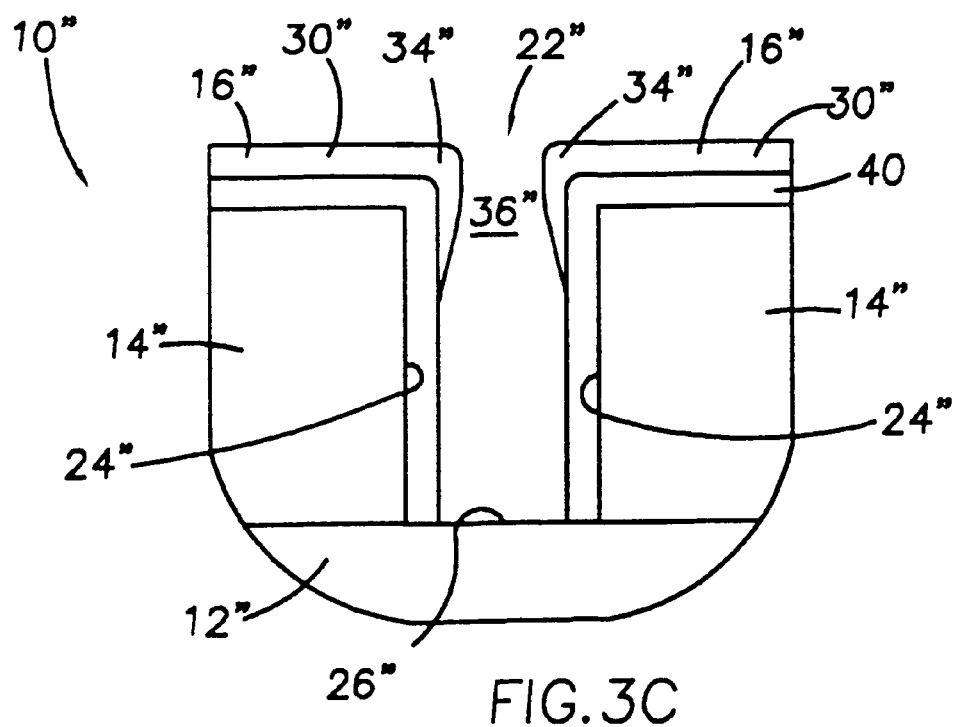

Referring to FIG. 3C, upon forming the self-aligned mask layer 30" having the desired thickness $T_1$ and coverage of the second etchable layer 40, the wafer 10" is then exposed to an etch gas using a conventional etch removal technique, to selectively etch at least a portion of the second etchable layer 40 from the bottom portion 26" of the feature 22". For example, an etch gas comprising hydrofluocarbons, such as $CHF_3$ or $CH_2F_2$, can be used to selectively etch a layer 40 of $Si_3N_4$ from bottom portion 26" comprising a silicon material (substrate 12"). By further example, an etch gas comprising $Cl_2$ or HBr, can be used to selectively etch a layer 40 of polysilicon from bottom portion 26" comprising a silicon material (substrate 12"). For a layer 40 that has properties that are similar to the bottom portion or base 26", for example, polysilicon layer 40 and crystalline silicon layer 12", an etch stop layer such as a thin oxide is typically formed on the base prior to the polysilicon deposition.

Although not shown, the feature 22" can be further extended past the etchable layer (e.g., into substrate 12") to form a feature having sidewalls made of two differing materials. The feature 22" can also be etched to a desired depth by employing repetitive deposits of additional mask layers onto the existing mask layer and etching the feature downwardly (not shown).

Figure 3D:
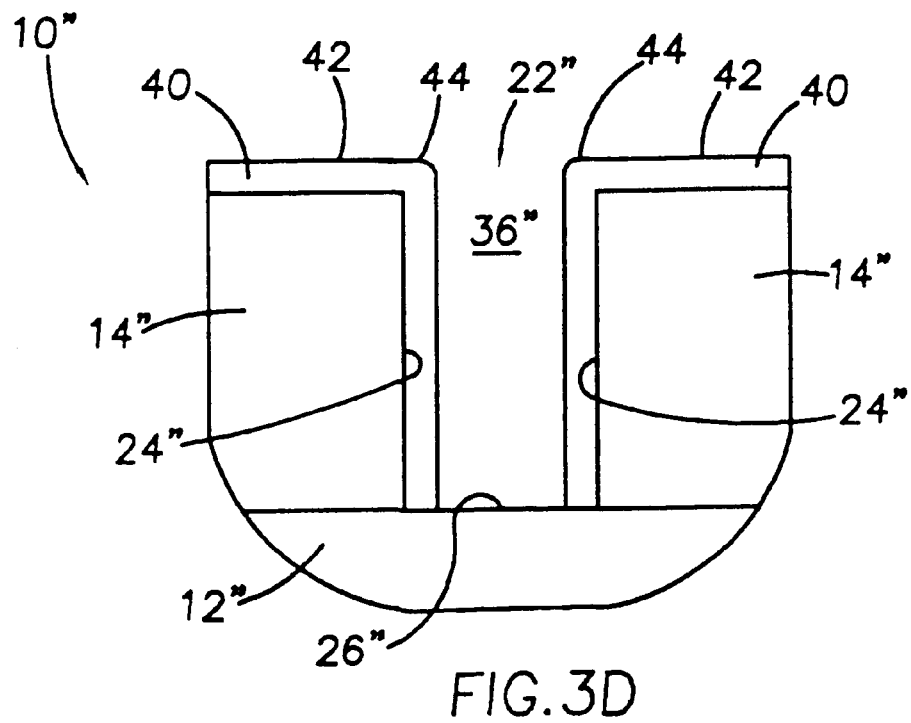

After completion of the etch to remove the second etchable layer 40 selectively from the bottom portion 26" of the feature 22", the self-aligned mask layer 30" can be removed as desired to expose the second etchable layer 40 including the surface 42 and the corners 46, and the sidewalls 24" of the feature 22" to result in the structure shown in FIG. 3D. A conventional removal process similar to those used for stripping photoresist as discussed hereinabove, can be used to remove the self-aligned mask layer 30", preferably by removing the layer with an oxygen-containing plasma—standard ashing, by use of a plasma stripper/plasma asher. The duration of the removal step depends, at least in part, on the thickness of the self-aligned mask layer 30". Optionally, the substrate 12' at the bottom portion 26" of the feature 22" can be surface treated to remove organic residues, for example, by a conventional $O_2$ clean etch.

The following example is given to illustrate specific embodiments of the present invention. Numerous other variations, however, are within the scope of the present invention.

EXAMPLE

A partially etched opening 8000 angstroms deep was extended to 1.8 µm deep using the self-aligned mask of the invention. This corresponds to extending the aspect ratio from approximately 3 to greater than 7 with the self-aligned mask as the only mask used.

An Applied Materials IPS etcher was used to plasma etch the substrate to form an opening using a $CHF_3$ plasma (870 W source power, 800 W bias power, 22 sccm $CHF_3$, 20 mtorr pressure, 200° C. ring temperature, 140° C. roof temperature), and to deposit the self-aligned mask by PECVD in the same chamber (1044 W source power, 100 W bias power, 10 sccm $C_4F_8$, 10 sccm $CHF_3$, 20 mtorr pressure, 200° C. ring temperature, 140° C. roof temperature).

Figure 4A:
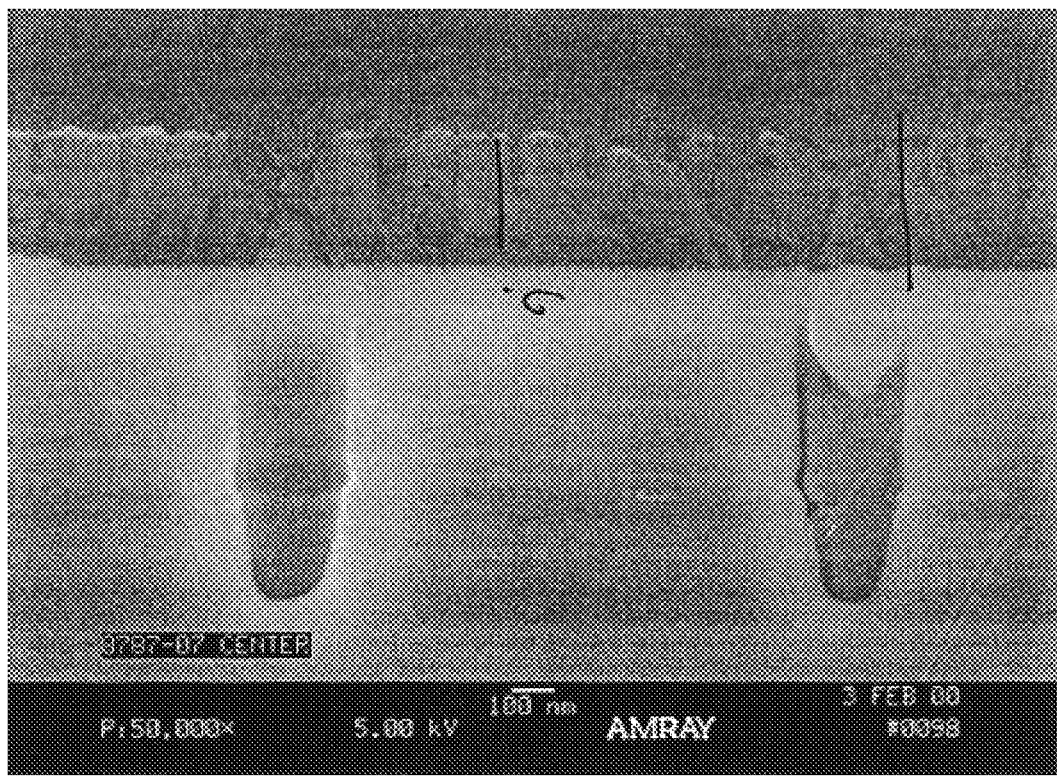
FIGS. 4A–4D are SEM photographs of a cross-sectional view of BPSG substrates with openings etched according to the first embodiment of the method of the invention.

As shown in FIG. 4A, a first BPSG substrate was etched to a depth of about 8000 angstroms to form an initial contact opening (870 W source power, 800 W bias power, 22 sccm $CHF_3$, 20 mtorr pressure, 200° C. ring temperature, 140° C. roof temperature). The original photoresist layer was then ashed, and a self-aligned film was deposited by PECVD (1044 W source power, 100 W bias power, 10 sccm $C_4F_8$, 10 sccm $CHF_3$, 20 mtorr pressure, 200° C. ring temperature, 140° C. roof temperature, 60 seconds). The resulting structure had significant breadloafing about the mouth of the opening. The deposition of the self-aligned mask film did not etch the oxide.

Figure 4B:
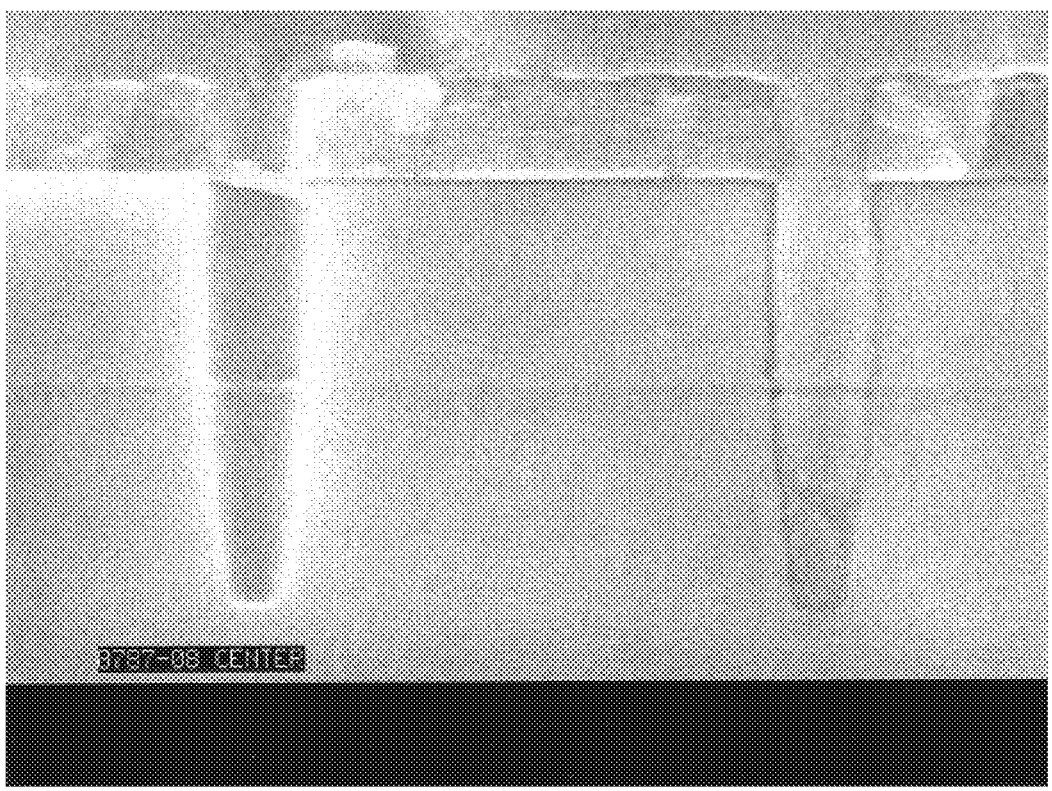

As shown in FIG. 4B, the BPSG layer of FIG. 4A was then etched (870 W source power, 800 W bias power, 22 sccm $CHF_3$, 20 mtorr pressure, 200° C. ring temperature, 140° C. roof temperature)). The etch extended the depth of the opening by 6000 angstroms, and the top surface dimensions remained unchanged. The width dimension of the contact opening was the same as in FIG. 4A. The deposited self-aligned mask layer continued to protect the top surface of the feature during the etch.

Figure 4C:
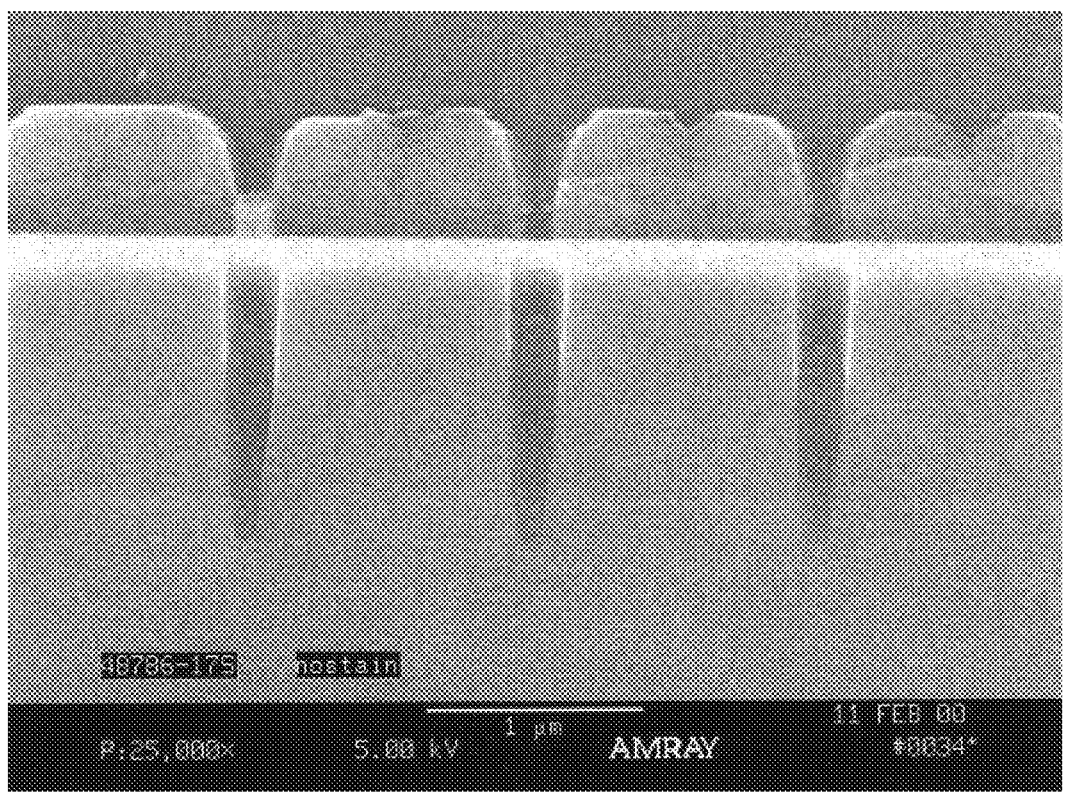

A second BPSG substrate was etched using a self-aligned mask using two deposition/etch cycles, according to the same conditions and settings as in FIGS. 4A–4B. As shown in FIG. 4C, an opening in an oxide layer of BPSG was first etched to a depth of 6000 angstroms using a photoresist mask. The photoresist was removed, and a self-aligned mask layer was deposited onto the surface of the BPSG layer by PECVD. The substrate was then processed through two deposition/etch cycles using the self-aligned mask layer. The process extended the depth to 1.4 $\mu$m. The resulting opening was 0.6 $\mu$m deeper than the opening provided by the previously described single deposition/etch cycle.

Figure 4D:
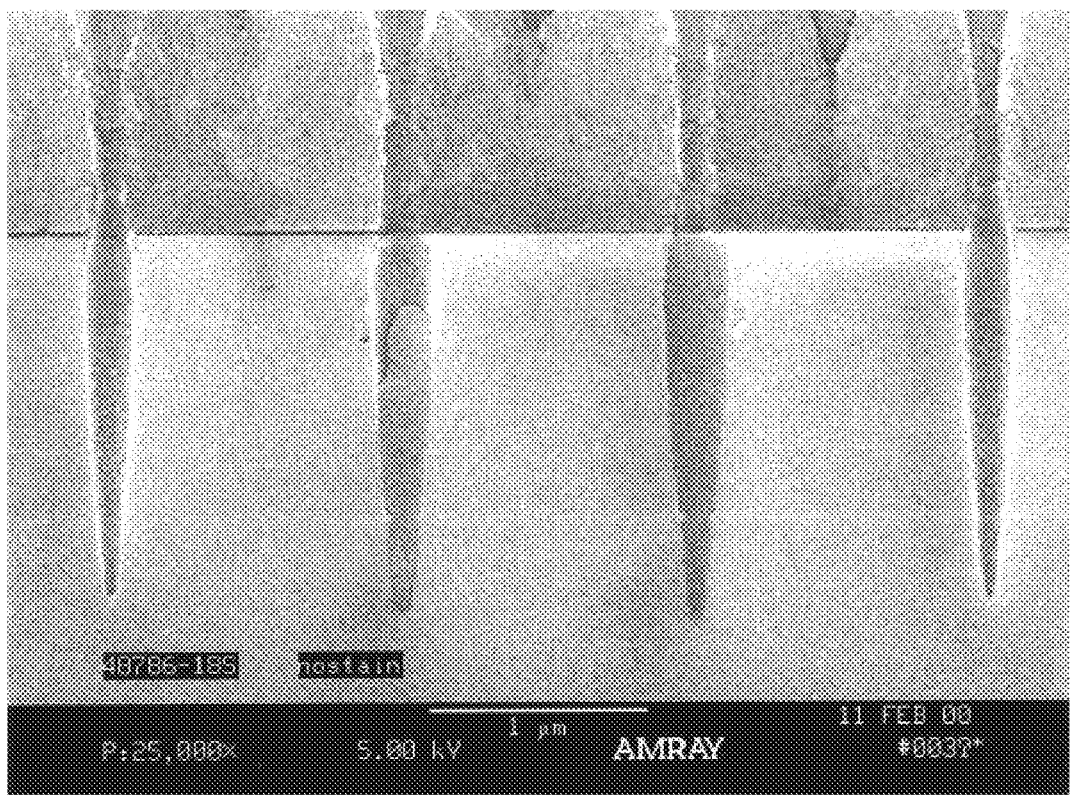

FIG. 4D shows the result of processing a third BPSG substrate through four deposition/etch cycles, according to the conditions and settings of FIGS. 4A–4B, using the self-aligned mask layer. Using a photoresist mask, the BPSG substrate was initially etched to a depth of 0.8 $\mu$m. The photoresist mask was removed, and the substrate was subjected to four deposition/etch cycles, resulting in an extension of the depth of the contact opening by 1 $\mu$m. The ratio of deposition/etch was high, as evidenced by the thick deposit of the self-aligned mask layer on the surface of the BPSG layer.

The result shown in FIG. 4A–4D demonstrate the feasibility of the process in a number of specific areas. It is possible to deposit the self-aligned mask layer on an etched feature that has been cleaned of resist, and to use the layer as an etch mask to deepen the feature. It is also shown that multiple applications of the deposit and etch can b used. This is critical for profile control and total etch depth. For example, the breadloafing seen in FIG. 4A occurred in the deposition cycles in FIG. 4D (the same deposition was used in all of these examples). It is apparent that a shorter deposition time would result in less breadloafing and a less tapered profile in FIG. 4D. Thus, the examples demonstrate the performance of the invention and suggest the proper optimization scheme to tailor the profiles to meet the requirements of the process. In addition, the removal of the photoresist mask after the first etch was done to evaluate this particular embodiment of the invention. The removal of this mask is not necessary. If the remaining resist mask is not removed from the surface, then thinner self-aligned layers are required to achieve the same result. Both methods can be used, depending on the requirements of the process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a self-aligned mask layer over a substrate, the method comprising the steps of:

providing the substrate having an exposed surface and an etched feature formed therein; the etched feature defined by sidewalls and a bottom portion, and having a first depth such that substantially no polymer material is deposited onto the substrate at the bottom portion of the etched feature in a subsequent polymer deposition step; and forming a self-aligned mask layer over the exposed surface of the substrate.

2. The method of claim 1, wherein the etched feature has an aspect ratio of at least about 0.5.

3. The method of claim 1, wherein the step of forming the self-aligned mask layer comprises depositing the mask layer from a polymerizing gas by plasma enhanced chemical vapor deposition.

4. The method of claim 3, wherein the polymerizing gas comprises a fluorocarbon gas, hydrofluorocarbon gas, or mixtures thereof.

5. The method of claim 4, wherein the polymerizing gas comprises a gas selected from the group consisting of $CF_4$, $CHF_3$, $CH_2F_2$, $CH_3F$, $C_2HF_5$, $C_2F_6$, $C_3F_6$, $C_3F_8$, $C_4F_6$, $C_4F_8$, and mixtures thereof.

6. The method of claim 3, wherein the polymerizing gas comprises a halocarbon selected from the group consisting of $CCl_4$, $CFCl_3$, $CF_2Cl_2$, $C_2HCl_3$, and mixtures thereof.

7. The method of claim 3, wherein the polymerizing gas comprises a hydrocarbon selected from the group consisting of $C_2H_4$, $C_3H_8$, $C_3H_6$, $C_4H_6$, $C_4H_8$, and mixtures thereof.

8. The method of claim 1, wherein the self-aligned mask layer is formed over the exposed surface of the substrate and within the etched feature over an exposed portion of the sidewalls contiguous with the surface of the substrate.

9. The method of claim 1, further comprising, after the step of forming the self-aligned mask layer, the step of etching into the substrate to extend the etched feature downwardly.

10. The method of claim 9, further comprising, after the step of etching the substrate, the steps of:

exposing the substrate to a polymerizing gas to deposit a self-aligned second mask layer over the formed mask layer such that exposed portions of the sidewalls contiguous with the substrate surface are covered by the second mask; and etching into the substrate to extend the etched feature downwardly into the substrate.

11. The method of claim 1, further comprising, prior to the step of providing the substrate, the step of forming the etched feature in the substrate, comprises the steps of:
   forming a masking layer over the exposed surface of the substrate;
   patterning an opening into the masking layer; and
   etching the substrate through the opening in the masking layer to form the etched feature in the substrate;
   whereby the self-aligned mask layer is formed over the masking layer.

12. The method of claim 11, wherein the etched feature comprises a contact opening.

13. A method of forming a self-aligned mask layer over a substrate, the method comprising the steps of:
   providing a substrate having an exposed surface and an etched feature formed therein; the etched feature defined by sidewalls and a bottom portion, and having a first depth such that substantially no polymer material is deposited onto the substrate at the bottom portion of the etched feature in a subsequent polymer deposition step; and
   depositing a self-aligned mask layer from a polymerizing gas over the exposed surface of the substrate.

14. The method of claim 13, wherein the self-aligned mask layer is formed within the etched feature over exposed portions of the sidewalls contiguous with the surface of the substrate.

15. The method of claim 13, wherein the polymerizing gas comprises a halocarbon gas, hydrofluorocarbon gas, hydrocarbon gas, or mixtures thereof.

16. The method of claim 15, wherein the polymerizing gas comprises a fluorine-comprising gas selected from the group consisting of $CF_4$, $CHF_3$, $CH_2F_2$, $CH_3F$, $C_2HF_5$, $C_2F_6$, $C_3F_6$, $C_3F_8$, $C_4F_6$, $C_4F_8$, and mixtures thereof.

17. The method of claim 13, further comprising, after the step of depositing the self-aligned mask layer, the step of etching into the substrate to extend the etched feature downwardly.

18. A method of forming a self-aligned mask layer over a substrate, comprising the steps of:
   providing the substrate having an exposed surface and a masking layer overlying the surface, and an etched feature formed through the masking layer and into the substrate; the etched feature defined by sidewalls and a bottom portion, and having a first depth such that substantially no polymer material is deposited onto the substrate at the bottom portion of the etched feature in a subsequent polymer deposition step; and
   forming a self-aligned mask layer over the exposed surface of the masking layer.

19. The method of claim 18, further comprising, after the step of forming the self-aligned mask layer, the step of second etching into the substrate to extend the etched feature downwardly to a second depth.

20. The method of claim 18, further comprising, prior to the step of forming the self-aligned mask layer, the step of removing at least a portion of the masking layer.

21. A method of forming a self-aligned mask layer over a substrate, comprising the steps of:
   providing a substrate having an exposed surface and a masking layer overlying the surface, the masking layer having at least one opening to expose an area of the exposed surface of the substrate;
   first etching into the substrate through the opening of the first mask layer to form an etched feature defined by sidewalls and a bottom portion, and a first depth such that substantially no polymer material is deposited onto the substrate at the bottom portion of the etched feature in a subsequent polymer deposition step;
   depositing an etch resistant polymer material from a polymerizing gas onto the masking layer to form a self-aligned mask layer such that an exposed portion of the sidewalls contiguous with the substrate surface are covered by the self-aligned mask layer, whereby substantially no polymeric material is deposited onto the substrate at the bottom portion of the etched feature.

22. The method of claim 21, further comprising, after the step of depositing the polymer material, the step of etching into the substrate to extend the etched feature downwardly to a second depth.

23. A method of forming a self-aligned mask layer over a substrate, comprising the steps of:
   providing a substrate having an exposed surface and a masking layer overlying the surface, the masking layer having at least one opening to expose an area of the exposed surface of the substrate;
   first etching into the substrate through the opening of the masking layer to form an etched feature defined by sidewalls and a bottom portion, and a first depth such that substantially no polymer material is deposited onto the substrate at the bottom portion of the etched feature in a subsequent polymer deposition step;
   depositing a self-aligned mask layer from a polymerizing gas onto the masking layer, the self-aligned mask layer comprising a polymer material of a thickness, such that an exposed portion of the sidewalls contiguous with the substrate surface are covered by the self-aligned mask layer.

24. The method of claim 23, further comprising, after the step of depositing the self-aligned mask layer, the step of second etching into the substrate to extend the etched feature downwardly to a second depth.

25. The method of claim 24, further comprising, after the step of etching into the substrate, the step of:
   exposing the substrate to a polymerizing gas to deposit a second self-aligned mask layer over the deposited self-aligned mask layer such that exposed portions of the sidewalls contiguous with the substrate surface are covered by the second self-aligned mask layer.

26. The method of claim 25, further comprising, after the step of depositing the second self-aligned mask layer, the step of third etching into the substrate to extend the etched feature downwardly.

27. A method of forming an etched feature having a high aspect ratio in an insulative layer overlying a substrate, comprising the steps of:
   providing the substrate having the insulative layer deposited thereon, the insulative layer having a surface with a masking layer overlying the surface, and a feature etched into the insulative layer using a first etch gas comprising at least one fluorine-comprising gas; the feature defined by sidewalls and a bottom portion, and having an aspect ratio of at least about 0.5;
   depositing a self-aligned mask layer from a polymerizing gas onto the masking layer, such that an exposed portion of the sidewalls contiguous with the substrate surface is covered by the self-aligned mask layer.

28. The method of claim 27, further comprising, after the step of depositing the self-aligned mask layer, the step of etching into the substrate to extend the feature downwardly.

29. The method of claim 27, wherein the insulative layer comprises silicon dioxide, phosphosilicate glass, or borophosphosilicate glass.

30. The method of claim 27, wherein the polymerizing gas comprises a fluorocarbon gas, hydrofluorocarbon gas, or mixtures thereof.

31. The method of claim 30, wherein the polymerizing gas comprises a gas selected from the group consisting of $CF_4$, $CHF_3$, $CH_2F_2$, $CH_3F$, $C_2HF_5$, $C_2F_6$, $C_3F_8$, $C_4F_6$, $C_4F_8$, and mixtures thereof.

32. The method of claim 30, wherein the polymerizing gas comprises a halocarbon selected from the group consisting of $CCl_4$, $CFCl_3$, $CF_2Cl_2$, $C_2HCl_3$, and mixtures thereof.

33. The method of claim 30, wherein the polymerizing gas comprises a hydrocarbon selected from the group consisting of $C_2H_4$, $C_3H_8$, $C_3H_6$, $C_4H_6$, $C_4H_8$, and mixtures thereof.

34. The method of claim 27, wherein the step of depositing the self-aligned mask layer is by plasma enhanced chemical vapor deposition.

35. The method of claim 27, wherein the etched feature is a contact opening.

36. A method of forming a self-aligned mask layer over a substrate, the method comprising the steps of:
providing a substrate having an exposed surface, and an etched feature formed therethrough, the etched feature defined by sidewalls and a bottom portion, and having a first depth such that substantially no polymer material is deposited onto the substrate at the bottom portion of the etched feature in a subsequent polymer deposition step; and
depositing a self-aligned mask layer to a thickness from a polymerizing gas onto the surface of the substrate by plasma enhanced chemical vapor deposition using a bias power, source power and deposition time, such that substantially no polymeric material is deposited onto the substrate at the bottom portion of the etched feature, whereby the thickness of the self-aligned mask layer is controlled by varying the bias power, the source power, the deposition time, or a combination thereof.

37. The method of claim 36, further comprising, after the step of depositing the self-aligned mask layer, the step of etching into the substrate to extend the etched feature downwardly.

38. The method of claim 36, wherein the etched feature is a contact opening.

39. A method of forming a self-aligned mask layer over a substrate, the method comprising the steps of:
providing a substrate having an exposed surface, and an etched feature formed therethrough, the etched feature defined by sidewalls and a bottom portion, and having a first depth such that substantially no polymer material is deposited onto the substrate at the bottom portion of the etched feature in a subsequent polymer deposition step; and
depositing a self-aligned mask layer to a thickness from a polymerizing gas onto the surface of the substrate by plasma enhanced chemical vapor deposition using a first bias power, first source power and first deposition time, such that substantially no polymeric material is deposited onto the substrate at the bottom portion of the etched feature, whereby the thickness or etch resistance of the self-aligned mask layer is controlled by varying the bias power, the source power, the deposition time, or a combination thereof.

40. The method of claim 39, wherein the step of depositing the self-aligned mask layer further comprises varying the first bias power, the first source power, the first deposition time, or a combination thereof, to control the thickness of the self-aligned second mask layer to effectively cover the surface of the substrate and exposed portions of the sidewalls contiguous with the substrate surface, while maintaining the mouth of the etched feature at an effective width for a subsequent etch to extend the etched feature downwardly into the substrate.

41. The method of claim 39, whereby, during the step of depositing the self-aligned mask layer, the first source power is decreased to decrease the rate of deposition of the polymerizing gas.

42. The method of claim 39, whereby, during the step of depositing the self-aligned mask layer, the first bias power is increased to decrease the rate of deposition of the polymerizing gas.

43. The method of claim 39, whereby, of depositing the self-aligned mask layer, the first deposition time is decreased to decrease the thickness of the self-aligned second mask layer.

44. The method of claim 39, wherein the etched feature is a contact opening.

45. A method of forming a self-aligned mask layer over a substrate, the method comprising the steps of:
providing a substrate having an exposed surface, and an etched feature formed therein, the etched feature defined by sidewalls and a bottom portion, and having a first depth such that substantially no polymer material is deposited onto the substrate at the bottom portion of the etched feature in a subsequent polymer deposition step; and
depositing a self-aligned mask layer to a thickness from a polymerizing gas onto the surface of the substrate by plasma enhanced chemical vapor deposition using a first bias power, first source power and first deposition time, such that substantially no polymeric material is deposited onto the substrate at the bottom portion of the etched feature, whereby the thickness of the self-aligned mask layer is controlled by varying the bias power, the source power, the deposition time, or a combination thereof; the self-aligned second mask layer having an etch resistance relative to the substrate.

46. The method of claim 45, whereby, during the step of depositing a self-aligned mask layer, the source power is varied to modify the amount of etch resistance of the polymeric material.

47. The method of claim 45, wherein the etched feature is a contact opening.

48. A semiconductor processing method of forming an etched feature, comprising the steps of:
providing a dual source high density plasma etcher, the etcher having a wafer receiver and being configured at a first bias power and a first source power;
providing a substrate onto the wafer receiver, the substrate having a layer formed thereover through which the etched feature is to be etched;
plasma etching the layer while the etcher is powered at the first bias power and the first source power; the etching defining the etched feature in the layer to a first selected depth, and the etched feature defined by a mouth, sidewalls, and a bottom portion;
second configuring the etcher to a first deposition time, and to decrease the first source power to a second source power, and decrease the first bias power to a second bias power;
depositing an etch resistant polymer material onto the substrate utilizing a polymerizing gas to form a self-aligned mask layer over the surface of the substrate and exposed portions of the sidewalls contiguous with the substrate surface, whereby substantially no polymeric material is deposited onto the substrate at the bottom portion of the etched feature;

third configuring the etcher to increase the second source power to about the first source power, and increase the second bias power to about the first bias power; and selectively plasma etching the layer to extend the etched feature downwardly into the layer to a second selected depth.

49. The method of claim 48, wherein the step of depositing the polymer material onto the substrate comprises varying the second bias power, the second source power, the first deposition time, or a combination thereof, to control the thickness of the self-aligned mask layer over the surface of the substrate and the sidewalls, and maintain the mouth of the etched feature at an effective width for a substantially anisotropic etching to extend the etched feature downwardly into the substrate.

50. The method of claim 48, wherein the step of second configuring the etcher comprises configuring the source power to provide the self-aligned mask layer having an etch resistance relative to the substrate.

51. The method of claim 48, wherein the step of depositing the etch resistant polymer material onto the substrate comprises varying the second source power to vary the etch resistance of the polymeric material relative to the substrate.

52. The method of claim 51, wherein the step of depositing the etch resistant polymer material onto the substrate comprises increasing the second source power to increase the etch resistance of the polymeric material relative to the substrate.

53. The method of claim 48, wherein the etched feature is a contact opening.

54. A method of forming a self-aligned mask layer over a substrate, the method comprising the steps of:

providing a substrate having an exposed surface and a mask layer overlying the surface, and an etched feature formed through the mask layer and the substrate, the etched feature defined by sidewalls and a bottom portion, and having a first depth such that substantially no polymer material is deposited onto the substrate at the bottom portion of the etched feature in a subsequent polymer deposition step;

removing the masking layer to expose the surface of the substrate; and forming a self-aligned mask layer over the exposed surface of the substrate.

55. The method of claim 54, wherein the etched feature has an aspect ratio of at least about 0.5.

56. The method of claim 54, further comprising, after the step of forming the self-aligned mask layer, the step of etching into the substrate to extend the etched feature downwardly to a second depth.

57. The method of claim 54, wherein the masking layer comprises photoresist.

58. The method of claim 54, wherein the etched feature is a contact opening.

59. A method of forming a self-aligned mask layer over a substrate, comprising the steps of:

providing a substrate having a surface and at least one etched feature defined by sidewalls and a bottom portion, and a layer of an etchable material overlying the surface of the substrate including the sidewalls and the bottom portion of the etched feature, the layer of the etchable material having a surface; the etched feature having a first depth such that substantially no polymer material is deposited onto the etchable layer overlying the substrate at the bottom portion of the etched feature in a subsequent polymer deposition step; and forming a self-aligned mask layer over the surface of the etchable layer and a portion of the etchable layer overlying the sidewalls and contiguous with the surface of the etchable layer, whereby substantially no polymeric material is deposited onto the etchable layer overlying the bottom portion of the etched feature.

60. The method of claim 59, wherein the etched feature has an aspect ratio of at least about 0.5.

61. The method of claim 59, wherein the etched feature comprises a contact opening.

62. The method of claim 59, further comprising, after the step of forming the self-aligned mask layer, the step of removing the etchable layer overlying the substrate on the bottom portion of the etched feature.

63. The method of claim 62, further comprising, after the step of removing the etchable layer, the step of repetitively forming additional self-aligned mask layers over the etchable layer and etching the substrate to extend the feature downwardly.

64. The method of claim 59, wherein the substrate comprises a material selected from the group consisting of monocrystalline silicon, epitaxial silicon, polysilicon, doped silicon, doped polysilicon, and suicides.

65. The method of claim 59, wherein the etchable layer comprises silicon nitride.

66. The method of claim 59, wherein the etchable material comprises a silicon oxide or a doped silicon oxide.

67. The method of claim 66, wherein the etchable material comprises an oxide selected from the group consisting of silicon dioxide, silicon dioxide deposited from tetraethylorthosilicate, phosphosilicate glass, and borophosphosilicate glass.

68. The method of claim 59, wherein the etchable material comprises a conducting material selected from the group consisting of polysilicon and a metal.

69. The method of claim 59, wherein the step of forming the self-aligned mask layer is by plasma enhanced chemical vapor deposition.

70. The method of claim 59, wherein the polymerizing gas comprises a fluorocarbon gas, hydrofluorocarbon gas, or mixtures thereof.

71. The method of claim 70, wherein the polymerizing gas comprises a gas selected from the group consisting of $CF_4$, $CHF_3$, $CH_2F_2$, $CH_3F$, $C_2HF_5$, $C_2F_6$, $C_3F_6$, $C_3F_8$, $C_4F_6$, $C_4F_8$, and mixtures thereof.

72. The method of claim 59, wherein the polymerizing gas comprises a halocarbon selected from the group consisting of $CCl_4$, $CFCl_3$, $CF_2Cl_2$, $C_2HCl_3$, and mixtures thereof.

73. The method of claim 59, wherein the polymerizing gas comprises a hydrocarbon selected from the group consisting of $C_2H_4$, $C_3H_8$, $C_3H_6$, $C_4H_6$, $C_4H_8$, and mixtures thereof.

74. A method of forming a self-aligned mask layer over a substrate, comprising the steps of:

providing a substrate having a surface and at least one etched feature defined by sidewalls and a bottom portion, and a layer of an etchable material overlying the surface of the substrate including the sidewalls and the bottom portion of the etched feature, the layer of the etchable material having a surface; the etched feature having an effective depth such that substantially no polymer material is deposited onto the etchable layer overlying the substrate at the bottom portion of the etched feature in a subsequent polymer deposition step; and depositing a self-aligned mask layer to a thickness from a polymerizing gas onto the surface of the etchable layer by plasma enhanced chemical vapor deposition using a first bias power, first source power and first deposition time, such that substantially no polymeric material is deposited onto the substrate at the bottom portion of the etched feature.

75. The method of claim 74, wherein the etched feature comprises a contact opening.

76. The method of claim 74, further comprising, after the step of depositing the self-aligned mask layer, the step of etching the etchable layer overlying the bottom portion of the etched feature using a second bias power and a second source power to expose the bottom portion of the etched feature.

77. The method of claim 74, whereby the thickness of the self-aligned mask layer is controlled by varying the bias power, the source power, the deposition time, or a combination thereof; the self-aligned second mask layer having an etch resistance relative to the substrate.

78. The method of claim 74, wherein the step of depositing the self-aligned mask layer further comprises varying the first bias power, the first source power, the first deposition time, or a combination thereof, to control the thickness of the self-aligned mask layer to effectively cover the surface of the etchable layer and the portion of the etchable layer overlying the sidewalls contiguous with the exposed surface of the etchable layer to prevent etching thereof during a subsequent etch step, while maintaining the mouth of the etched feature at an effective width to substantially anisotropically etch the etchable layer overlying the bottom portion of the etched feature.

79. The method of claim 74, whereby, during the step of depositing the self-aligned mask layer, the first source power is decreased to decrease the rate of deposition of the polymerizing gas.

80. The method of claim 74, whereby, during the step of depositing the self-aligned mask layer, the first bias power is increased to decrease the rate of deposition of the polymerizing gas.

81. The method of claim 74, whereby, during the step of depositing the self-aligned mask layer, the first deposition time is decreased to decrease the thickness of the self-aligned mask layer.

82. A method of forming an etched feature in a substrate, comprising the steps of:
providing a substrate having a surface and at least one etched feature defined by sidewalls and a bottom portion, and a layer of an etchable material overlying the surface of the substrate including the sidewalls and the bottom portion of the etched feature, the layer of the etchable material having a surface; the etched feature having an effective depth such that substantially no polymer material is deposited onto the etchable layer overlying the substrate at the bottom portion of the etched feature in a subsequent polymer deposition step; and
depositing a self-aligned mask layer to a thickness from a polymerizing gas onto the surface of the substrate by plasma enhanced chemical vapor deposition using a first bias power, first source power and first deposition time, such that substantially no polymeric material is deposited onto the substrate at the bottom portion of the etched feature; the self-aligned mask layer having an etch resistance relative to the substrate; and
etching the etchable layer overlying the bottom portion of the opening using a second bias power and a second source power to expose the bottom portion of the opening.

83. The method of claim 82, wherein the etched feature comprises a contact opening.

84. The method of claim 82, whereby, during the step of exposing the etchable layer to the polymerizing gas, the source power is varied to modify the amount of etch resistance of the polymeric material.

85. A semiconductor processing method of forming an etched feature, comprising the steps of:
providing a dual source high density plasma etcher, the etcher having a wafer receiver and being first configured at a first bias power, a first source power, and a first deposition time;
providing a substrate onto the wafer receiver, the substrate having a surface and at least one etched feature defined by sidewalls and a bottom portion, and a layer formed thereover to be etched from the bottom portion of the opening, the layer having a surface;
depositing an etch resistant polymer material onto the substrate while the etcher is powered at the first bias power, the first source power, and the first deposition time, utilizing a polymerizing gas to form a self-aligned mask layer over the surface of the layer and a portion of the layer overlying the sidewalls contiguous with the surface of the layer, whereby substantially no polymeric material is deposited onto the substrate at the bottom portion of the etched feature;
second configuring the etcher to vary the first source power to a second source power, and vary the first bias power to a second bias power; and
selectively plasma etching the layer overlying the bottom portion of the etched feature.

86. The method of claim 85, wherein the step of depositing the etch resistant polymer material onto the layer comprises varying the first bias power, the first source power, the first deposition time, or a combination thereof, to control the thickness of the self-aligned mask layer to effectively cover the surface of the layer and the layer overlying the sidewalls to prevent etching of the layer during a subsequent etch step, while maintaining the mouth of the etched feature at an effective width to substantially anisotropically etch the layer overlying the bottom portion of the etched feature.

87. The method of claim 85, wherein the step of providing the etcher includes configuring the source power of the etcher to provide the self-aligned mask layer with an etch resistance relative to the substrate.

88. The method of claim 85, wherein the step of depositing the etch resistant polymer material onto the layer comprises varying the first source power to vary the etch resistance of the polymer material relative to the layer.

89. A method of forming a self-aligned mask layer over a substrate, the method comprising the steps of:
providing a substrate having a surface and a masking layer overlying the surface, the masking layer having at least one opening to expose an area of the surface of the substrate; the opening defined by sidewalls and a bottom portion, and having a first depth such that substantially no polymer material is deposited onto the substrate at the bottom portion of the opening in a subsequent polymer deposition step; and
forming a self-aligned mask layer over the masking layer; whereby substantially no polymeric material is deposited onto the substrate at the bottom portion of the opening.

90. The method of claim 89, wherein the opening in the masking layer has an aspect ratio of at least about 0.5.

91. The method of claim 89, wherein the step of forming the self-aligned mask layer comprises depositing the masking layer from a polymerizing gas by plasma enhanced chemical vapor deposition.

92. The method of claim 91, wherein the polymerizing gas comprises a fluorocarbon gas, hydrofluorocarbon gas, or mixtures thereof.

93. The method of claim 89, wherein the self-aligned mask layer is formed over the surface of the masking layer and within the opening over an exposed portion of the sidewalls contiguous with the surface of the masking layer.

94. The method of claim 89, further comprising, after the step of forming the self-aligned mask layer, the step of etching into the substrate to formed an etched feature.

95. The method of claim 94, further comprising, after the step of etching the substrate, the step of:

depositing a self-aligned second mask layer from a polymerizing gas onto the first self-aligned mask layer.

96. The method of claim 95, further comprising, after the step of depositing a self-aligned second mask layer, the step of:

etching into the substrate to extend the opening downwardly into the substrate.

97. The method of claim 89, wherein the masking layer comprises photoresist.

98. A method of forming a self-aligned mask layer over a substrate, the method comprising the steps of:

providing a substrate having a surface and a mask layer overlying the surface, the mask layer having at least one opening to expose an area of the surface of the substrate; the opening defined by sidewalls and a bottom portion, and having a first depth such that substantially no polymer material is deposited onto the substrate at the bottom portion of the opening in a subsequent polymer deposition step; and depositing an etch resistant polymer material from a polymerizing gas onto the mask layer to form a self-aligned second mask layer such that an exposed portion of the sidewalls contiguous with the substrate surface are covered by the self-aligned mask layer, and substantially no polymeric material is deposited onto the substrate at the bottom portion of the opening.

99. A method of forming a self-aligned mask layer over a substrate, the method comprising the steps of:

providing the substrate having an exposed surface and an etched feature formed therein; the etched feature defined by sidewalls and a bottom portion, and having a first depth such that substantially no polymer material is deposited onto the substrate at the bottom portion of the etched feature in a subsequent polymer deposition step; and repetitively forming a self-aligned mask layer over the exposed surface of the substrate, and etching into the substrate to extend the etched feature downwardly to a depth.

100. The method of claim 99, wherein the etched feature initially formed in the substrate has an aspect ratio of at least about 0.5.

101. A method of forming a self-aligned mask layer over a substrate, comprising the steps of:

providing a substrate having an exposed surface and a masking layer overlying the surface, the masking layer having at least one opening to expose an area of the exposed surface of the substrate;

first etching into the substrate through the opening of the masking layer to form an etched feature defined by sidewalls and a bottom portion, and a first depth such that substantially no polymer material is deposited onto the substrate at the bottom portion of the etched feature in a subsequent polymer deposition step;

repetitively depositing a self-aligned mask layer from a polymerizing gas onto the masking layer and etching into the substrate to extend the etched feature downwardly; the self-aligned mask layer comprising a polymer material of a thickness, such that exposed portions of the sidewalls contiguous with the substrate surface are covered by the self-aligned mask layer.

* * * * *

UNITED STATES PATENT AND TRADEMARK OFFICE
CERTIFICATE OF CORRECTION

PATENT NO. : 6,451,705 B1
DATED : September 17, 2002
INVENTOR(S) : Shane J. Trapp et al.

It is certified that error appears in the above-identified patent and that said Letters Patent is hereby corrected as shown below:

Column 4,
Line 9, replace "2C)" with -- 2C --.

Column 7,
Line 57, replace "comers" with -- corners --.

Signed and Sealed this

Twenty-first Day of January, 2003

JAMES E. ROGAN
*Director of the United States Patent and Trademark Office*